US008410541B2

United States Patent
Wang et al.

(10) Patent No.: US 8,410,541 B2
(45) Date of Patent: Apr. 2, 2013

(54) CMOSFET DEVICE WITH CONTROLLED THRESHOLD VOLTAGE CHARACTERISTICS AND METHOD OF FABRICATING THE SAME

(75) Inventors: Wenwu Wang, Beijing (CN); Huilong Zhu, Poughkeepsie, NY (US); Shijie Chen, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 12/935,364

(22) PCT Filed: Jun. 24, 2010

(86) PCT No.: PCT/CN2010/074384
§ 371 (c)(1),
(2), (4) Date: Sep. 29, 2010

(87) PCT Pub. No.: WO2011/009361
PCT Pub. Date: Jan. 27, 2011

(65) Prior Publication Data
US 2012/0104506 A1 May 3, 2012

(30) Foreign Application Priority Data
Jul. 22, 2009 (CN) .......................... 2009 1 0089597

(51) Int. Cl.
*H01L 29/792* (2006.01)
(52) U.S. Cl. ............................. 257/324; 257/E29.276
(58) Field of Classification Search .................. 257/310, 257/324, E29.286
See application file for complete search history.

(56) References Cited

U.S. PATENT DOCUMENTS

| 7,772,073 B2 * | 8/2010 | Clark et al. ................... 438/287 |
| 2008/0237694 A1 * | 10/2008 | Specht et al. ................. 257/324 |
| 2009/0085175 A1 | 4/2009 | Clark et al. |
| 2010/0184260 A1 * | 7/2010 | Luo et al. ...................... 438/154 |

FOREIGN PATENT DOCUMENTS

| CN | 1885560 A | 12/2006 |
| CN | 101364600 A | 2/2009 |
| CN | 101752237 A | 6/2010 |

OTHER PUBLICATIONS

International Search Report and Written Opinion for International Application No. PCT/CN2010/074384, mailed Sep. 30, 2010.
Office Action of Oct. 26, 2011 for Chinese Application No. 200910089597.0.
Chinese Office Action, dated Jul. 12, 2012.

\* cited by examiner

*Primary Examiner* — William D Coleman
(74) *Attorney, Agent, or Firm* — Knobbe Martens Olson & Bear, LLP

(57) ABSTRACT

There is provided a CMOSFET device with threshold voltage controlled by means of interface dipoles and a method of fabricating the same. A cap layer, for example a very thin layer of poly-silicon, amorphous silicon, or $SiO_2$, is interposed inside high-k gate dielectric layers of the CMOSFET device, and the threshold voltage is adjusted by means of the interface dipoles formed by the cap layer inside the high-k gate dielectric layers. According to the present invention, it is possible to effectively optimize the threshold voltage of the CMOSFET device without significantly increasing EOT thereof.

15 Claims, 4 Drawing Sheets

CMOSFET DEVICE WITH CONTROLLED THRESHOLD VOLTAGE CHARACTERISTICS AND METHOD OF FABRICATING THE SAME

RELATED APPLICATIONS

This application is a national phase under 35 U.S.C. §371 of International Application No. PCT/CN2010/074384, filed Jun. 24, 2010, which claims priority to Chinese Patent Application No. 200910089597.0, filed Jul. 22, 2009, each of which is hereby incorporated by reference in its entirety.

FIELD OF INVENTION

The present invention generally relates to the field of high-k gate dielectric and metal gate configuration in the nano-scale Complementary Metal-Oxide-Semiconductor (CMOS) technique, and in particular, to a Complementary Metal-Oxide-Semiconductor Field Effect Transistor (CMOSFET) device with threshold voltage characteristics controlled by means of interface dipoles and a method of fabricating the same.

DESCRIPTION OF PRIOR ART

The CMOS technique, as the core of the microelectronics technique, has become a base of modern electronic products. With continuously scaling of feature sizes of CMOS devices, the physical thickness of $SiO_2$, serving as a gate dielectric material of the CMOS devices, is approaching its limit. Further, problems, such as poly-silicon depletion effect due to a poly-silicon gate electrode, too high gate resistance, and diffusion of doped boron atoms, are becoming more and more serious. All those problems are to be solved by development and optimization of new materials, new processes, and new device structures.

Gordon Moore, the co-founder of Intel, has said that the utilization of high dielectric constant (high-k) gate dielectric materials and mental gate materials is one biggest breakthrough since transistors of poly-silicon gate Metal-Oxide-Semiconductor (MOS) are proposed, and thus represents a milestone. The introduction of the high-k gate dielectric materials results in an increased physical thickness of a gate dielectric layer at a same Equivalent Oxidation Thickness (EOT), which in turn makes it possible to effectively suppress tunneling current(s). Further, the introduction of the metal gate materials not only eliminates the depletion effect of poly-silicon gate electrodes and diffusion of doped atoms, but also effectively reduces resistances of the gate electrodes, while solving the problem of incompatibility of the high-k gate dielectric materials with the poly-silicon gates.

Presently, some advances have been made on the research of the high-k gate dielectric materials. Some research group has reported an ultra-thin (EOT: 0.5 nm, physical thickness: 2.4 nm) high-k gate dielectric insulating film of $HfO_2$ with a low leakage current ($J_g$: 10 A/cm$^2$) which may be formed by means of interface control and filming process optimization. This represents a leading achievement over the world just in terms of high-k gate dielectric film manufacturing processes. However, tests for device performance show that a flat band voltage ($V_{fb}$) is significantly shifted to the vicinity of the center of a bandgap of silicon with extremely reducing of EOT (~0.5 nm). This is caused mainly due to compatibility and thermal stability of the high-k gate dielectrics and the metal gate electrodes, and will greatly increase power consumption of devices. Further, some research group has reported that the abnormal shift of V is caused by special interface characteristics between the gate electrode and the high-k gate dielectric, for example, a pinning effect of a Fermi level due to the formation of Si—Hf bonds at an interface between a poly-silicon gate and $HfO_2$, and a pining effect of a Fermi level due to the formation of dipoles at an interface between a metal gate and a high-k gate dielectric and an interface between a high-k gate dielectric and $SiO_2$. Obviously, the research on threshold voltage controlling of a CMOS device with a metal gate/high-k gate dielectric stack relates to not only the work function of the metal gate material itself, but also the metal gate/high-k gate dielectric stack in its entirety. Further, the threshold voltage of the device can be adjusted by means of effects due to the dipoles at the interface of the gate stack.

SUMMARY OF THE INVENTION

Problems to be Solved

In view of the above problems, it is an object of the present invention to provide a CMOSFET device with threshold voltage characteristics controlled by means of interface dipoles and a method of fabricating the same, by which it is possible to effectively control a threshold voltage of the CMOS device.

Means Adopted to Solve the Problem

In order to achieve the above object, according to an aspect of the invention, there is provided a CMOSFET device with threshold voltage characteristics controlled by means of interface dipoles, comprising:

a semiconductor substrate, for example, a silicon substrate;

an interface layer of oxide or nitride grown on the semiconductor substrate, for example, a $SiO_2$ interface layer;

a first high-k gate dielectric layer deposited on the interface layer;

a cap layer deposited on the first high-k gate dielectric layer;

a second high-k gate dielectric layer deposited on a structure formed of the first high-k gate dielectric layer and the cap layer; and a gate electrode layer deposited on a stack formed of the first high-k gate dielectric layer, the cap layer, and the second high-k gate dielectric layer.

Preferably, the interface layer has a thickness of about 0.3 nm-1 nm.

Preferably, the materials for the cap layer comprises a very thin layer of poly-silicon, amorphous silicon, or $SiO_2$. This cap layer may be deposited between two or more layers of different high-k gate dielectrics, and has a thickness of about 0.1 nm-5 nm.

Preferably, the first and/or second high-k gate dielectric layer comprises one or more high-k gate dielectric layers.

Preferably, the gate electrode layer comprises a one-layer gate electrode structure or a multi-layer gate electrode structure.

Preferably, the materials for the first and second high-k gate dielectric layers comprises at least one of $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, $LaSiO_x$, $Y_2O_3$, AlN, nitrides of those materials, nitroxides of those materials, oxides of other rare earth elements, nitrides of other rare earth elements, $SiN_x$, SiON, and any combination thereof.

Preferably, the materials for the gate electrode layer comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon, metal silicides, and any combination thereof.

In order to achieve the above object, according to another aspect of the invention, there is provided a method of fabricating a CMOSFET device with threshold voltage characteristics controlled by means of interface dipoles, comprising:

growing an interface layer on a semiconductor substrate;

depositing a first high-k gate dielectric layer on the interface layer;

depositing a cap layer on the first high-k gate dielectric layer;

depositing a second high-k gate dielectric layer on a structure formed of the first high-k gate dielectric layer and the cap layer;

depositing a gate electrode layer on a stack formed of the first high-k gate dielectric layer, the cap layer and the second high-k gate dielectric layer, so as to form a gate stack; and further completing the CMOSFET device based on the gate stack.

Preferably, the interface layer has a thickness of about 0.3 nm-4 nm.

Preferably, the high-k gate dielectric layer introduced by the method into the CMOSFET device comprises a stack of two or more layers. The cap layer is deposited on the first high-k gate dielectric layer. With introduction of this cap layer, interface dipoles of different magnitude are formed at interfaces between the cap layer and the upper and lower high-k gate dielectric layers. The threshold voltage of the device can be effectively controlled by adjustment of polarity and magnitude of the interface dipoles.

Preferably, the cap layer is a very thin layer of poly-silicon, amorphous silicon, or $SiO_2$, and is deposited between two or more layers of different high-k gate dielectrics. The deposition thereof comprises physical deposition, chemical vapor deposition, or atom layer deposition.

Preferably, the cap layer has a thickness of about 0.1 nm-5 nm.

Preferably, the first and/or second high-k gate dielectric layer comprises one or more high-k gate dielectric layers.

Preferably, the gate electrode layer comprises a one-layer gate electrode structure or a multi-layer gate electrode structure Preferably, the materials for the first and/or second high-k gate dielectric layer comprises at least one of $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, $LaSiO_x$, $Y_2O_3$, AlN, nitrides of those materials, nitroxides of those materials, oxides of other rare earth elements, nitrides of other rare earth elements, $SiN_x$, SiON, and any combination thereof.

Preferably, the materials for the gate electrode layer comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, RuTa, $HfRu_x$, poly-silicon, metal silicides, and any combination thereof.

Advantageous Effects

According to the present invention, a CMOSFET device with threshold voltage characteristics controlled by means of interface dipoles and a method of fabricating the same are provided, where a cap layer, for example a very thin layer of poly-silicon, amorphous silicon, or $SiO_2$, is interposed inside the high-k gate dielectric layers of the CMOSFET device, and the threshold voltage is adjusted by means of the interface dipoles formed by the cap layer inside the high-k gate dielectric layers. According to the present invention, it is possible to effectively control the threshold voltage of CMOSFET devices without significantly increasing EOT (Equivalent Oxidation Thickness) thereof.

DETAILED DESCRIPTION OF PREFERRED EMBODIMENTS

To make the objects, means, and advantages of the present invention more apparent, the present invention is described in detail in conjunction with embodiments thereof while referring to attached drawings.

According to the present invention, a CMOSFET device with threshold voltage characteristics controlled by means of interface dipoles and a method of fabricating the same are provided, wherein a very thin cap layer, for example a very thin layer of poly-silicon, amorphous silicon, or $SiO_2$, is interposed inside high-k gate dielectric layers of the gate stack of the CMOSFET device, and the threshold voltage is adjusted by means of the interface dipoles formed by the very thin cap layer inside the high-k gate dielectric layers.

Specifically, a very thin cap layer, for example a very thin layer of poly-silicon, amorphous silicon, or $SiO_2$, is deposited between two or more layers of high-k gate dielectrics, and then, being subject to a subsequent annealing process at a high temperature, is converted partially or completely into an interface layer of $SiO_2$ or M (Metal)-Si—O polynary compound. This interface layer interacts with the high-k gate dielectric layers underlying and overlying it respectively to form interface dipoles. Those interface dipoles not only counteract the interface dipoles inherent in the stack formed of the Si substrate, the $SiO_2$ interface layer, and the first high-k gate dielectric layer which cause shift of a flat band voltage ($V_{fb}$) to the center of a bandgap (the inherent interface dipoles may deteriorate the threshold voltage characteristics), but also enhance additional interface dipoles which are advantageous to the CMOSFET device. Thus, it is possible to effectively optimize the threshold voltage of the CMOSFET device without significantly increasing EOT of the device.

Figure 1:
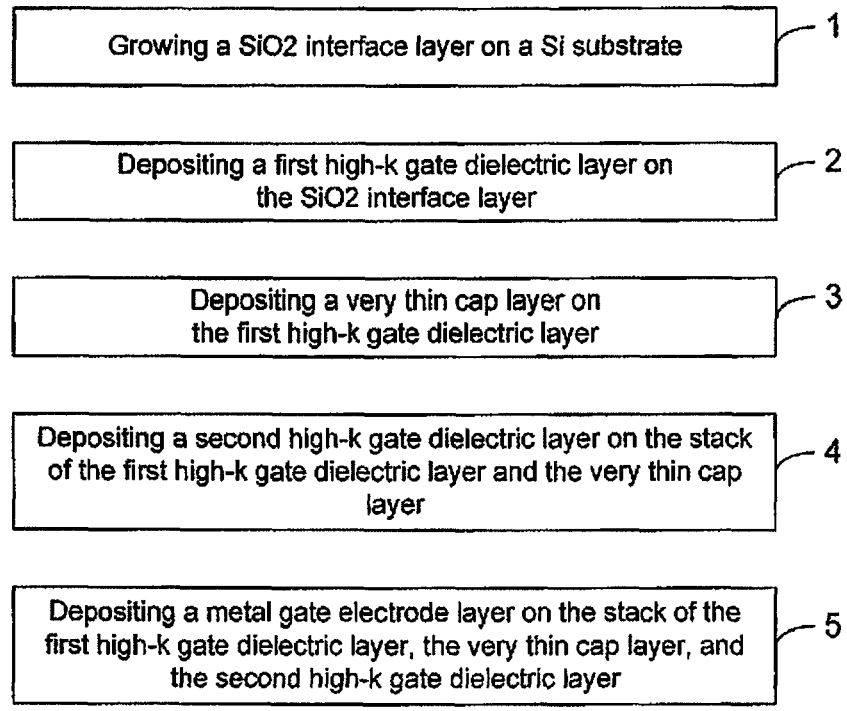
FIG. 1 is a flow chart showing a method of fabricating a CMOSFET device with threshold voltage characteristics controlled by means of interface dipoles according to an embodiment of the present invention.

As shown in FIG. 1, which is a flow chart showing a method of fabricating a CMOSFET device with threshold voltage characteristics controlled by means of interface dipoles according to an embodiment of the present invention, the method comprises:

step 1: growing an interface layer (for example, $SiO_2$) on a semiconductor (for example, Si) substrate;

step 2: depositing a first high-k gate dielectric layer on the interface layer;

step 3: depositing a very thin cap layer on the first high-k gate dielectric layer;

step 4: depositing a second high-k gate dielectric layer on the structure formed of the first high-k gate dielectric layer and the very thin cap layer; and step 5: depositing a gate electrode layer on the stack formed of the first high-k gate dielectric layer, the very thin cap layer, and the second high-k gate dielectric layer.

FIGS. 2-11 are diagrams showing respective processes of fabricating a CMOSFET device with threshold voltage characteristics controlled by means of interface dipoles according to an embodiment of the present invention.

Figure 2:
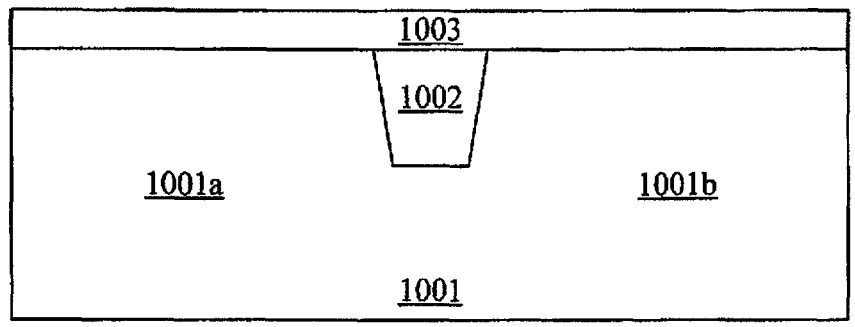
FIGS. 2-11 are diagrams showing respective processes of fabricating a CMOSFET device with threshold voltage characteristics controlled by means of interface dipoles according to an embodiment of the present invention.

As shown in FIG. 2, on a prepared semiconductor (for example, Si) substrate 1001, an interface layer 1003 (for example, $SiO_2$) with a thickness of about 0.5 nm is grown. Here, for example, the semiconductor substrate 1001 comprises a first region 1001a and a second region 1001b for PMOS and NMOS respectively, which are separated from each other preferably by means of a Shallow Trench Isolation (STI) 1002.

Figure 3:
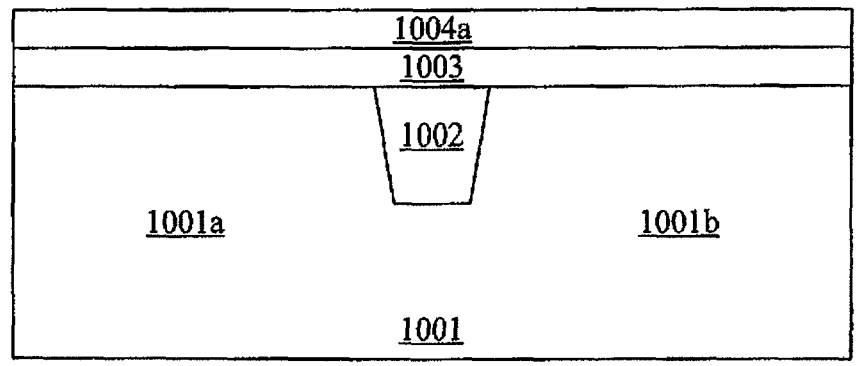

Next, as shown in FIG. 3, a first high-k gate dielectric layer 1004a, for example $HfO_2$, with a thickness of about 3 nm is deposited on the interface layer 1003.

Figure 4:
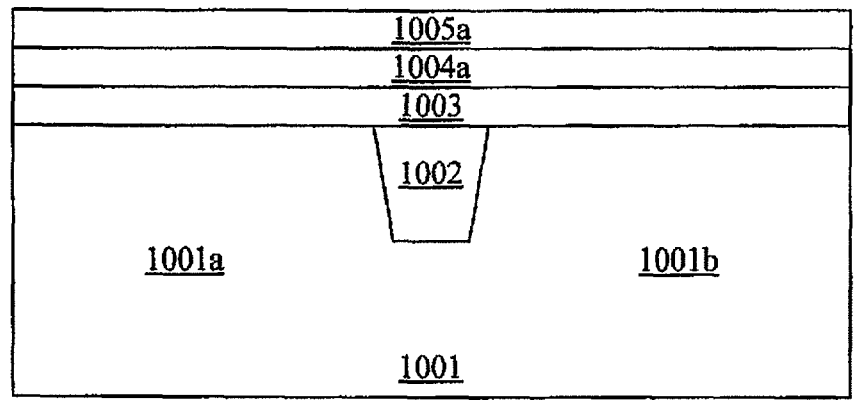

Then, as shown in FIG. 4, a very thin cap layer 1005a, for example a very thin layer of poly-silicon, amorphous silicon, or $SiO_2$, is deposited on the first high-k gate dielectric layer 1004a.

Figure 5:
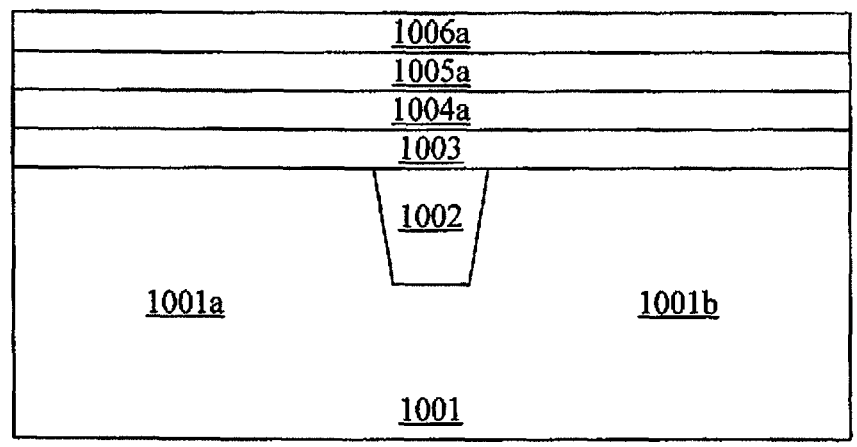

Next, as shown in FIG. 5, a second high-k gate dielectric layer 1006a, for example $HfAlO_x$, is deposited on the very thin cap layer 1005a. Here, it is to be noted that the first high-k gate dielectric layer 1004a and the second high-k gate dielectric layer 1006a are made of different materials.

Figure 6:
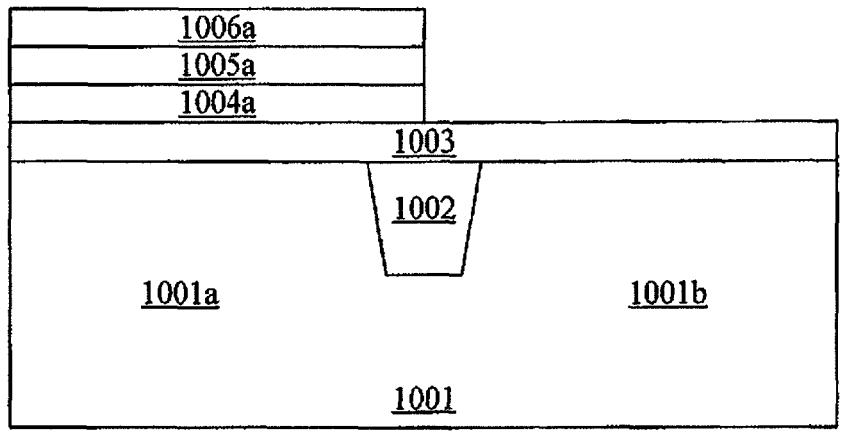

Then, as shown in FIG. 6, a portion of the stack formed of the high-k gate dielectric layer 1004a, the cap layer 1005a, and the high-k gate dielectric layer 1006a on the second region 1001b is removed by means of, for example, photolithography.

Figure 7:
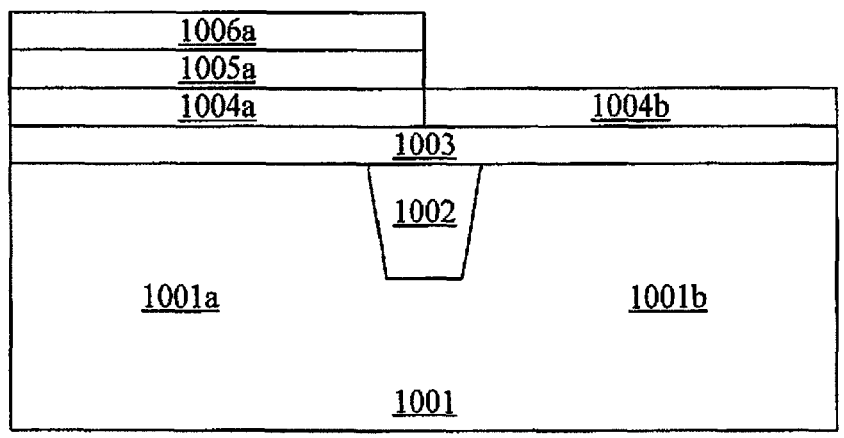

Next, as shown in FIG. 7, a third high-k gate dielectric layer 1004b, for example $HfO_2$, is deposited on the second region 1001b. Here, it is to be noted that the third high-k gate dielectric layer 1004b may be made of a material same as or different from that of the first high-k gate dielectric layer 1004a and/or the second high-k gate dielectric layer 1006a.

Figure 8:
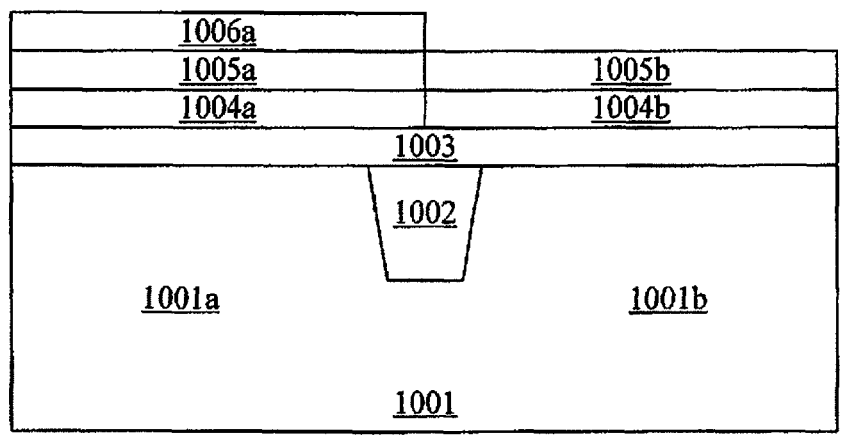

Then, as shown in FIG. 8, a very thin cap layer 1005b, for example a very thin layer of poly-silicon, amorphous silicon, or $SiO_2$, is deposited on the third high-k gate dielectric layer 1004b.

Figure 9:
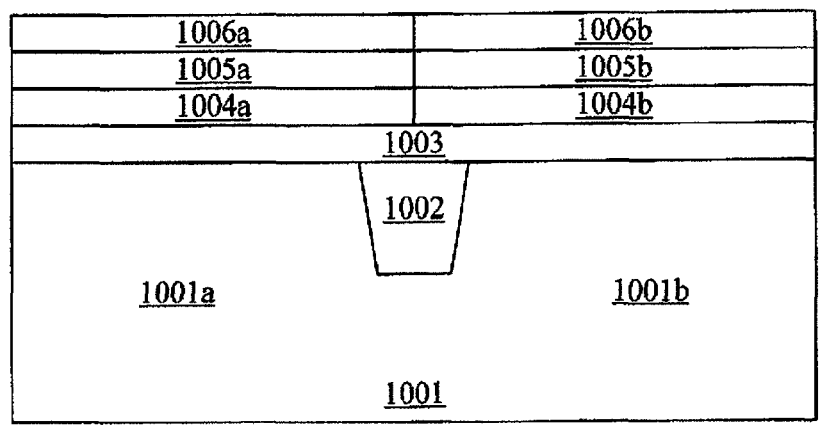

Subsequently, as shown in FIG. 9, a fourth high-k gate dielectric layer 1006b, for example $La_2O_3$, is deposited on the very thin cap layer 1005b. Here, it is to be noted that the fourth high-k gate dielectric layer 1006b is made of a material which is different from that of the third high-k gate dielectric layer 1004b, and which is same as or different from that of the first high-k gate dielectric layer 1004a and/or the second high-k gate dielectric layer 1006a.

Figure 10:
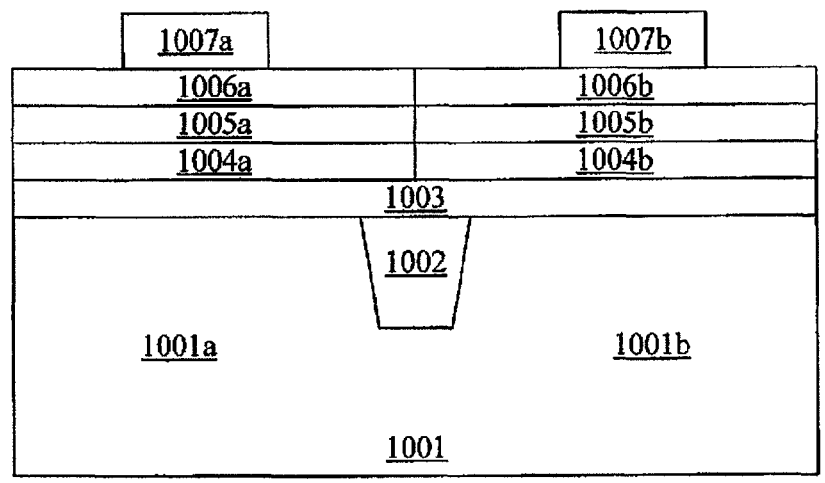

Next, as shown in FIG. 10, gate electrode layers 1007a and 1007b, for example a TiAlN gate electrode and a TiN gate electrode, are deposited on the first region 1001a and the second region 1001b respectively. The gate electrode layers 1007a and 1007b may be of the same or different materials. Thus, gate stacks for PMOS and NMOS are formed on the first region 1001a and the second region 1001b respectively.

Figure 11:
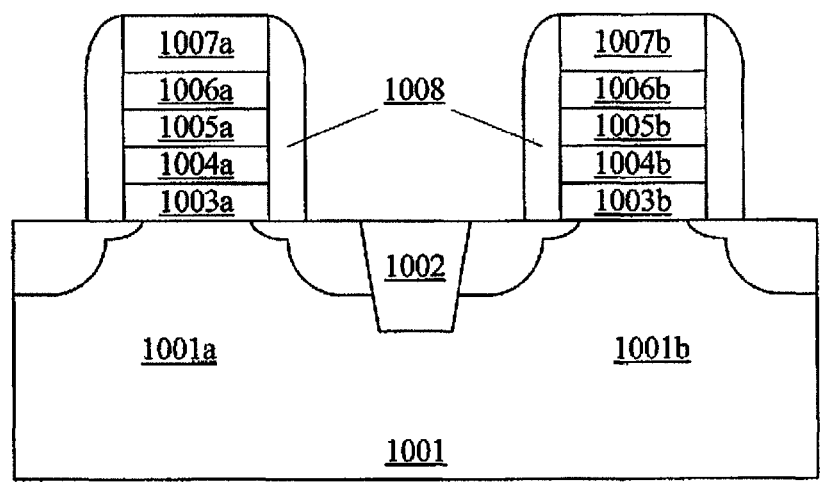

Finally, as shown in FIG. 11, patterning and other processes are performed on the above structure to form the CMOSFET devices. Other processes for completing the CMOSFET devices based on the gate stacks, such as spacer forming and ion implanting, are well known in the art. Those skilled in the art can conceive various ways to carry out those processes, which are omitted here. In FIG. 11, spacers 1008 formed on both sides of the gate stacks are also shown.

Referring to FIG. 11, the CMOSFET device according to the embodiment of the invention comprises: a semiconductor substrate (1001); an interface layer (1003a; 1003b) grown on the semiconductor substrate; a first high-k gate dielectric layer (1004a; 1004b) deposited on the interface layer; a cap layer (1005a; 1005b) deposited on the first high-k gate dielectric layer; a second high-k gate dielectric layer (1006a; 1006b) deposited on the cap layer; and a gate electrode layer (1007a; 1007b) deposited on the second high-k gate dielectric layer.

In the above descriptions, the very thin cap layer is interposed between the upper and lower high-k gate dielectric layers. Here, it is to be noted that this very thin cap layer may be deposited between two or more different high-k gate dielectric layers. That is to say, the high-k gate dielectric layer (that is, the first and/or second high-k gate dielectric layer, or the third and/or fourth high-k gate dielectric layer) on either side of the cap layer may comprise one or more high-k gate dielectric layer.

Though the embodiment where both of PMOS and NMOS are formed is described above, it is to be understood by those skilled in the art that only one MOS or a plurality of MOS's may be formed. Further, in the above descriptions, PMOS and NOMS are fabricated at the same time. However, it is apparent that they may be fabricated respectively.

The above described embodiments are provided to further illustrate the objects, means and advantages of the present invention in detail. However, it is to be understood that those embodiments are only for the purpose of illustrating rather than limiting the invention. All the variations, equivalents and modifications to those embodiments within the spirit and principle of the invention fall into the scope of the invention defined by the attached claims.

What is claimed is:

1. A Complementary Metal-Oxide-Semiconductor Field Effect Transistor (CMOSFET) device, comprising: a semiconductor substrate; an interface layer grown on the semiconductor substrate; a first high-k gate dielectric layer deposited on the interface layer; a cap layer deposited on the first high-k gate dielectric layer;

a second high-k gate dielectric layer deposited on a structure formed of the first high-k gate dielectric layer and the cap layer; and a gate electrode layer deposited on a stack formed of the first high-k gate dielectric layer, the cap layer, and the second high-k gate dielectric layer, wherein the cap layer comprises poly-silicon, amorphous silicon, or $SiO_2$, and interacts with the first and second high-k gate dielectric layers to create interface dipoles to adjust a threshold voltage of the CMOSFET device.

2. The CMOSFET device according to claim 1, wherein the interface layer is formed of $SiO_2$ and has a thickness of about 0.3 nm-1 nm.

3. The CMOSFET device according to claim 1, wherein the cap layer has a thickness of about 0.1 nm-5 nm.

4. The CMOSFET device according to claim 1, wherein the first high-k gate dielectric layer comprises one or more high-k gate dielectric layers, and the second high-k gate dielectric layer comprises one or more high-k gate dielectric layers.

5. The CMOSFET device according to claim 1, wherein the gate electrode layer comprises a one-layer gate electrode structure or a multi-layer gate electrode structure.

6. The CMOSFET device according to claim 1, wherein the materials for the first and second high-k gate dielectric layers comprise at least one of HfO2, HfSiOx, $HfZrO_x$, $HfO_2$, $HfSiO_x$, $HfZrO_x$, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, $LaSiO_x$, $Y_2O_3$, AlN, nitrides of those materials, oxynitrides of those materials, oxides of other rare earth elements, nitrides of other rare earth elements, $SiN_x$, SiON, and any combination thereof.

7. The CMOSFET device according to claim 1, wherein the material for the gate electrode layer comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon, metal silicides, and any combination thereof.

8. A method of fabricating a Complementary Metal-Oxide-Semiconductor Field Effect Transistor (CMOSFET) device, comprising: growing an interface layer on a semiconductor substrate; depositing a first high-k gate dielectric layer on the interface layer; depositing a cap layer on the first high-k gate dielectric layer;

depositing a second high-k gate dielectric layer on a structure formed of the first high-k gate dielectric layer and the cap layer; and depositing a gate electrode layer on a stack formed of the first high-k gate dielectric layer, the cap layer, and the second high-k gate dielectric layer, wherein the cap layer comprises poly-silicon, amorphous silicon, or SiO, and interacts with the first and second high-k gate dielectric layers to create interface dipoles to adjust a threshold voltage of the CMOSFET device.

9. The method of fabricating the CMOSFET device according to claim 8, wherein the interface layer is formed of $SiO_2$ and has a thickness of about 0.3 nm-1 nm.

10. The method of fabricating the CMOSFET device according to claim 8, wherein the first high-k gate dielectric layer comprises one or more high-k gate dielectric layers, and the second high-k gate dielectric layer comprises one or more high-k gate dielectric layers.

11. The method of fabricating the CMOSFET device according to claim 8, wherein the gate electrode layer comprises a one-layer gate electrode structure or a multi-layer gate electrode structure.

12. The method of fabricating the CMOSFET device according to claim 8, wherein the materials for the first and second high-k gate dielectric layers comprise at least one of HfO2, HfZrOx, HfSiOx, HfON, HfSiON, $HfAlO_x$, $Al_2O_3$, $ZrO_2$, $ZrSiO_x$, $Ta_2O_5$, $La_2O_3$, $HfLaO_x$, $LaAlO_x$, $LaSiO_x$, $Y_2O_3$, AlN, nitrides of those materials, oxynitrides of those materials, oxides of other rare earth elements, nitrides of other rare earth elements, $SiN_x$, SiON, and any combination thereof.

13. The method of fabricating the CMOSFET device according to claim 8, wherein the materials for the gate electrode layer comprises at least one of TiN, TaN, MoN, HfN, TaAlN, TiAlN, MoAlN, HfAlN, TaYbN, TaErN, TaTbN, TaC, HfC, TaSiC, HfSiC, Pt, Ru, Ir, W, Mo, Re, $RuO_x$, $RuTa_x$, $HfRu_x$, poly-silicon, metal silicides, and any combination thereof.

14. The method of fabricating the CMOSFET device according to claim 10, wherein the cap layer is deposited by physical deposition, chemical vapor deposition, or atom layer deposition.

15. The method of fabricating the CMOSFET device according to claim 10, wherein the cap layer has a thickness of about 0.1 nm-5 nm.

* * * * *